United States Patent
Yamada et al.

(10) Patent No.: US 8,467,490 B2
(45) Date of Patent: Jun. 18, 2013

(54) COMMUNICATION SYSTEM, RECEIVER AND RECEPTION METHOD

(75) Inventors: Takaaki Yamada, Kanagawa (JP); Hiroki Kihara, Kanagawa (JP); Tatsuya Sugioka, Tokyo (JP); Hisashi Owa, Kanagawa (JP); Taichi Niki, Tokyo (JP); Yukio Shimomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 657 days.

(21) Appl. No.: 12/401,657

(22) Filed: Mar. 11, 2009

(65) Prior Publication Data
US 2009/0232250 A1 Sep. 17, 2009

(30) Foreign Application Priority Data
Mar. 12, 2008 (JP) ................. P2008-063004

(51) Int. Cl.
*H03D 3/24* (2006.01)
(52) U.S. Cl.
USPC ........... 375/373; 375/327; 375/340; 375/342; 375/346; 375/350; 375/351; 375/355; 375/362; 375/371; 375/374; 375/375; 375/376
(58) Field of Classification Search
CPC ....................................................... H04L 7/033
USPC ................. 375/295, 316, 317, 319, 340, 346, 375/350, 351, 354, 371, 373–376, 327, 342, 375/355, 362
See application file for complete search history.

(56) References Cited

U.S. PATENT DOCUMENTS

| 5,629,651 | A | * | 5/1997 | Mizuno | 331/34 |
| 5,761,244 | A |   | 6/1998 | Hedberg |  |
| 5,822,573 | A | * | 10/1998 | Saeki et al. | 713/503 |
| 5,859,669 | A | * | 1/1999 | Prentice | 348/469 |
| 6,351,169 | B2 | * | 2/2002 | Kuge | 327/161 |
| 6,700,414 | B2 | * | 3/2004 | Tsujino | 327/3 |
| 6,801,080 | B1 | * | 10/2004 | Arcus | 327/563 |
| 7,667,546 | B2 | * | 2/2010 | Kim | 331/16 |
| 2003/0098721 | A1 |   | 5/2003 | Tsujino |  |
| 2003/0190006 | A1 |   | 10/2003 | Nagano |  |
| 2006/0002483 | A1 | * | 1/2006 | Kim | 375/257 |
| 2006/0033542 | A1 | * | 2/2006 | Lin et al. | 327/156 |

FOREIGN PATENT DOCUMENTS
WO  WO 2008 026164  3/2008

OTHER PUBLICATIONS

Wang et al. "Level Shifters for High-Speed 1-v to 3.3. Interfaces in a 0.13-μm Cu-Interconnection/Low-k CMOS Technology", 2001, pp. 1-4.*

* cited by examiner

*Primary Examiner* — Sophia Vlahos
(74) *Attorney, Agent, or Firm* — Frommer Lawrence & Haug LLP; William S. Frommer

(57) ABSTRACT

A communication system includes: a transmitter adapted to transmit a synchronizing clock and serial data synchronous with the synchronizing clock over a line at low amplitude; and a receiver adapted to receive the serial data and synchronizing clock from the transmitter. The receiver includes an amplifier adapted to amplify the received synchronizing clock of low amplitude to restore the clock to its original amplitude, a latched comparator adapted to latch the received serial data in synchronism with a reproduction clock, and a phase-locked circuit.

7 Claims, 10 Drawing Sheets

FIG.11A
① SDT

FIG.11B
①' SYNC CLK

FIG.11C
② DLCLK

FIG.11D
③ DRCLK2

FIG.11E
④ RCLK
(DRCLK)

FIG.11F
⑤ CK
(RCLK)

COMMUNICATION SYSTEM, RECEIVER AND RECEPTION METHOD

BACKGROUND OF THE INVENTION

1. Field of the Invention

The present invention relates, for example, to a communication system, receiver and reception method using a low-amplitude data transmission technique capable of providing high-speed data transmission between chips in proximity to each other.

2. Description of the Related Art

In related art, the I/O (input/output) standards commercialized to date for high-speed data transmission between chips in proximity to each other such as SSTL_1.8 and LVDS have the following drawbacks.

Firstly, if the supply voltage was changed or a finer manufacturing process was introduced, it was impossible to establish connection. Therefore, it was necessary to take the trouble of adding a manufacturing step adapted to manufacture an I/O circuit with elements having an obsolete structure, which resulted in reduced performance and increased cost.

Secondly, although the power consumption of the line drivers alone is as much as several tens of W/Ch., the transmission rate is low or 600 Mbps. As a result, it is impossible to deliver data bandwidths of 10 Gbps or more which are considered necessary for future video mobile equipment because of the power consumption and LSI pin count.

In order to solve these problems, a variety of low-amplitude data transmission techniques have been proposed (refer, for example, to Mats Hedberg et al., "I/O Family with 200 mV to 500 mV Supply Voltage," ISSCC Dig. of Technical Papers pp. 340-341, 1997, R. Palmer et al., "A 14 mW 6.25 Gb/s Transceiver in 90 nm CMOS for Serial Chip-to-Chip Communications", and USP Publication No. 5761244 (hereinafter referred to as Non-Patent Documents 1 and 2 and Patent Document 1)).

By the way, a low-amplitude data transmission technique adapted to transmit data, for example at an amplitude of 0.2 V, is used for this type of communication system between chips in proximity to each other.

A so-called source synchronous technique is used for such transmission.

In a source synchronous communication method, the transmitter transmits data and a clock synchronous with the data, and the receiver latches the received data in synchronism with the received clock signal.

FIG. 1 is a diagram illustrating a configuration example of a typical communication system using a low-amplitude data transmission technique.

A communication system 1 shown in FIG. 1 includes a transmitter 2, receiver 3 and transmission line 4.

The transmitter 2 includes a data selector 21 and line drivers 22 and 23 and transmits a plurality of transmission data DT1 and STD2 phase-locked to each other and a clock signal CLK, which is synchronous with the transmission data, to the receiver 3 via the transmission line 4.

The receiver 3 includes amplifiers 31 and 32, a digital locked loop (DLL) 33, clock buffer 34 and data reproduction circuit 35. The amplifiers 31 and 32 amplify the low-amplitude data and clock to the amplitude appropriate to the supply voltage of the chip. The digital locked loop 33 generates a reproduction clock RCK phase-locked to the clock signal CLK that has been amplified by the amplifier 31. The data reproduction circuit 35 reproduces the transmitted data DT1 and DT2 amplified by the amplifier 32 in synchronism with the reproduction clock RCK.

SUMMARY OF THE INVENTION

However, although the techniques disclosed in Non-Patent Document 1 and Patent Document 1 were able to solve the first problem described above, it was impossible for these techniques to provide a sufficiently improved transmission rate due to the frequency characteristics of, and the delay caused by, the amplifiers 31 and 32 adapted to expand the amplitude.

More specifically, the data output from the amplifier 32 is significantly affected by ISI due to insufficient frequency characteristics of the amplifier 32 as illustrated in FIG. 2, thus causing a hindrance to faster transmission.

On the other hand, Non-Patent Document 2 discloses a technique capable of solving both the first and second problems described above.

However, this technique uses clock data recovery (CDR) to provide faster transmission. As a result, coding is required including an 8-bit-to-10-bit conversion which leads to a significant increase in circuit scale. Further, software processing by the processor LSI is a prerequisite. However, this processing cannot be readily handled by the LSI.

It is desirable to provide a communication system, receiver and reception method capable of compensating for the delay caused by an amplifier adapted to expand the amplitude so as to reproduce an optimal clock for data reproduction, and by extension, reproduce data with high accuracy.

A communication system according to an embodiment of the present invention includes a transmitter adapted to transmit a synchronizing clock and serial data synchronous with the synchronizing clock over a line at low amplitude. The communication system also includes a receiver adapted to receive the serial data and synchronizing clock from the transmitter. The receiver includes an amplifier adapted to amplify the received synchronizing clock of low amplitude to restore the clock to its original amplitude. The receiver further includes a latched comparator adapted to latch the received serial data in synchronism with a reproduction clock. The receiver still further includes a phase-locked circuit which includes a frequency multiplier. The frequency multiplier generates the reproduction clock based on the synchronizing clock which has been restored to its original amplitude from the low-amplitude synchronizing clock by the amplifier. The reproduction clock is compensated for the delay caused by the amplifier using a replica amplifier which is configured in a similar manner to the amplifier. The replica amplifier is provided in a phase-locked loop.

Another embodiment of the present invention is a receiver for receiving a synchronizing clock transmitted over a line at low amplitude and serial data synchronous with the synchronizing clock. The receiver includes an amplifier adapted to amplify the received synchronizing clock of low amplitude to restore the clock to its original amplitude. The receiver further includes a latched comparator adapted to latch the received serial data in synchronism with a reproduction clock. The receiver still further includes a phase-locked circuit which includes a frequency multiplier. The frequency multiplier generates the reproduction clock based on the synchronizing clock which has been restored to its original amplitude from the low-amplitude synchronizing clock by the amplifier. The reproduction clock is compensated for the delay caused by the amplifier using a replica amplifier. The replica amplifier is configured in a similar manner to the amplifier and provided in a phase-locked loop.

A delay element should preferably be provided in the phase-locked loop to introduce a delay adapted to imitate a setup signal of the latched comparator.

The phase-locked circuit should preferably include a voltage-controlled oscillator, a frequency divider, the replica amplifier and a phase comparator. The voltage-controlled oscillator generates the reproduction clock. The frequency divider divides the frequency of the reproduction clock. The replica amplifier receives the reproduction clock frequency-divided by the frequency divider and amplifies the clock. The phase comparator compares the phases of the synchronizing clock amplified by the amplifier and the output clock from the replica amplifier and outputs a control signal commensurate with the comparison result to the voltage-controlled oscillator.

The replica amplifier should preferably have a level-down circuit at its input stage. The level-down circuit has a field effect transistor adapted to receive the frequency-divided reproduction clock at its gate so as to reduce the input signal level.

A further embodiment of the present invention is a reception method for receiving a synchronizing clock and serial data synchronous with the synchronizing clock. The reception method includes a step of amplifying the received synchronizing clock of low amplitude to restore the clock to its original amplitude. The reception method further includes a step of generating the reproduction clock with a frequency multiplier based on the synchronizing clock which has been restored to its original amplitude from the low-amplitude synchronizing clock by the amplifier. The reproduction clock is compensated for the delay caused by the amplifier using a replica amplifier which is configured in a similar manner to the amplifier and provided in a phase-locked loop. The reception method still further includes a step of latching the received serial data using a latched comparator in synchronism with the reproduction clock.

According to embodiments of the present invention, a transmitter transmits a synchronizing clock and serial data synchronous with the synchronizing clock over a line at low amplitude. The synchronizing clock and serial data are received by a receiver.

In the receiver, the received synchronizing clock of low amplitude is amplified to restore the clock to its original amplitude.

Next, a frequency multiplier generates a reproduction clock based on the synchronizing clock which has been restored to its original amplitude from the low-amplitude synchronizing clock by an amplifier. The reproduction clock is compensated for the delay caused by the amplifier using a replica amplifier. The replica amplifier is configured in a similar manner to the amplifier and provided in a phase-locked loop.

Then, the received serial data is latched by a latched comparator in synchronism with the generated reproduction clock.

The present invention compensates for the delay caused by an amplifier adapted to expand the amplitude.

This permits reproduction of an optimal clock for data reproduction, and by extension, reproduction of data with high accuracy.

BRIEF DESCRIPTION OF THE DRAWINGS

FIGS. 11A to 11F are a timing diagram of the receiver of the communication system according to the present embodiment;

DETAILED DESCRIPTION OF THE PREFERRED EMBODIMENTS

The preferred embodiments of the present invention will be described below with reference to the accompanying drawings.

Figure 1:
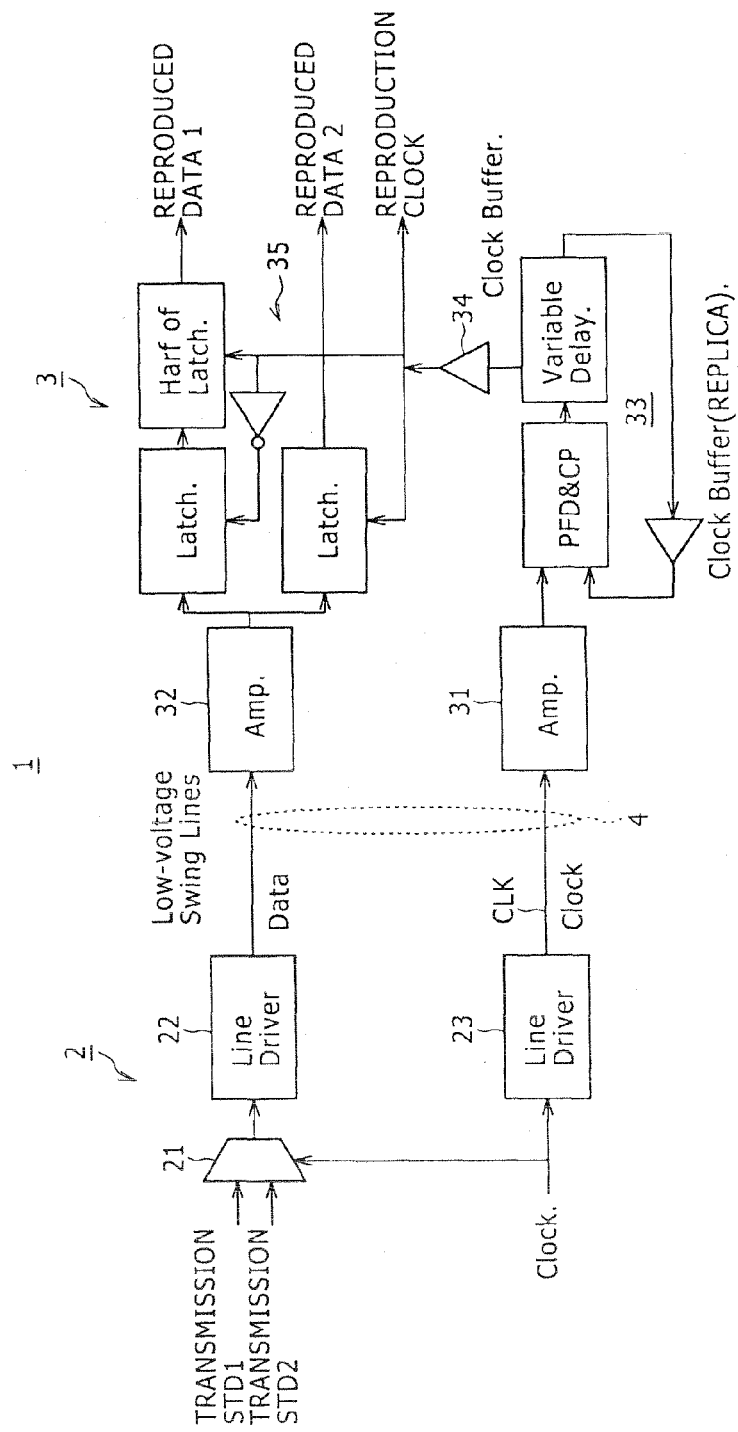
FIG. 1 is a diagram illustrating a configuration example of a typical communication system using a low-amplitude data transmission technique.
Figure 2:
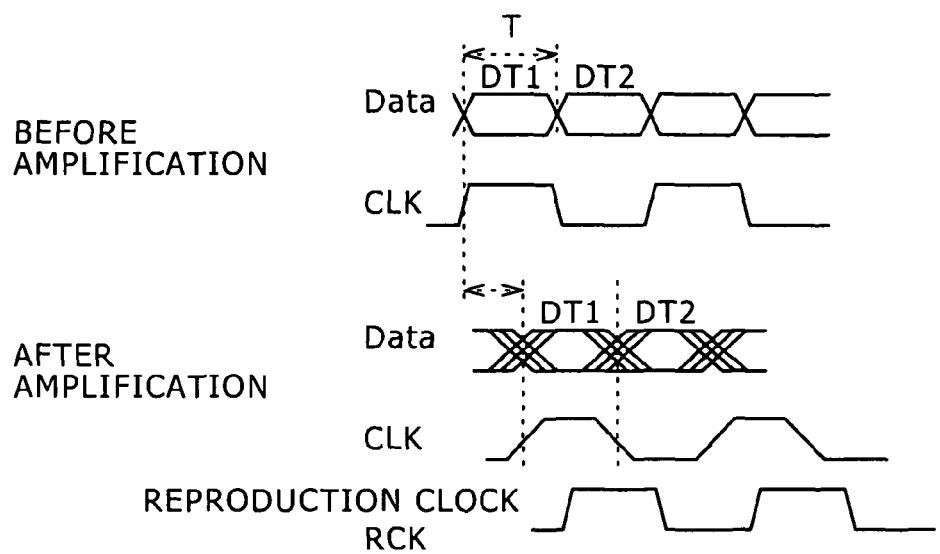
FIG. 2 is a diagram for describing the problem with the communication system shown in FIG. 1.
Figure 3:
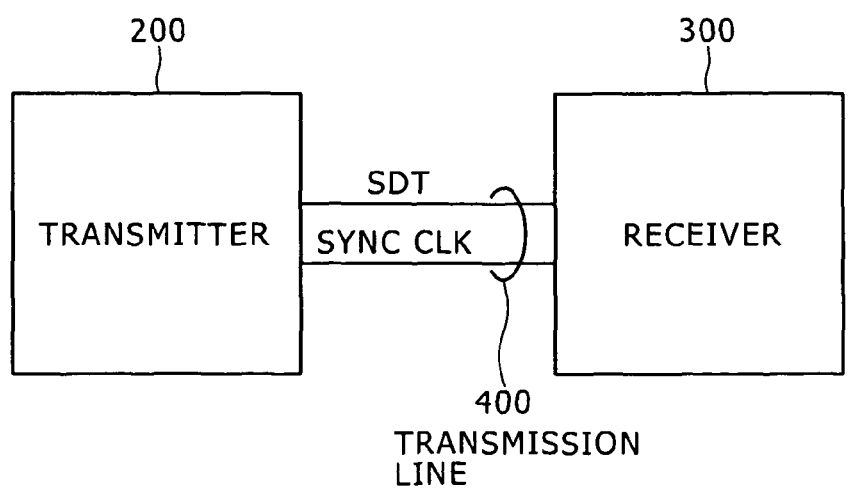
FIG. 3 is a diagram illustrating the basic configuration of a communication system according to an embodiment of the present invention.
Figure 4:
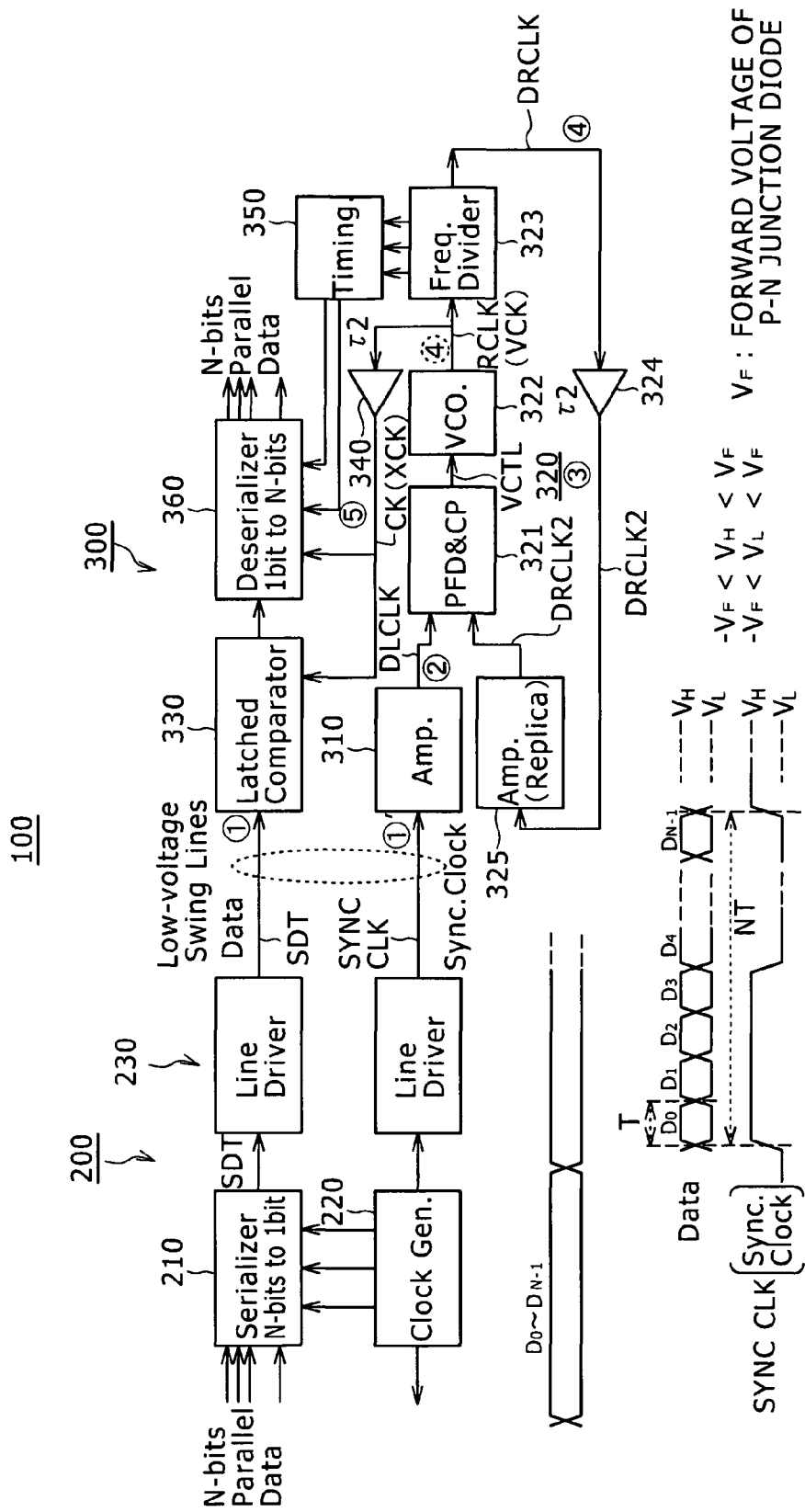
FIG. 4 is a diagram more specifically illustrating a transmitter and receiver shown in FIG. 3.

FIG. 3 is a diagram illustrating the basic configuration of a communication system according to an embodiment of the present invention. FIG. 4 is a diagram more specifically illustrating a transmitter and receiver shown in FIG. 3.

A communication system 100 includes a transmitter 200, receiver 300 and transmission line 400.

The transmitter 200 includes a serializer 210, clock generator 220 and line driver 230. The serializer 210 converts N-bit parallel data, which is updated every time T, into 1-bit serial data which is updated every time T/N. The clock generator 220 generates a synchronizing clock SYNC CLK whose level changes at the end of the serialization. The line driver 230 transmits serial data at a low amplitude close to the ground potential (e.g., 200 mV (0.2 V) or 300 mV (0.3 V)). The synchronizing clock SYNC CLK and serial data SDT are transmitted by the same line driver.

Both the serial data SDT and synchronizing clock SYNC CLK from the transmitter 200 are conveyed to the receiver over the transmission line 400.

Figure 5:
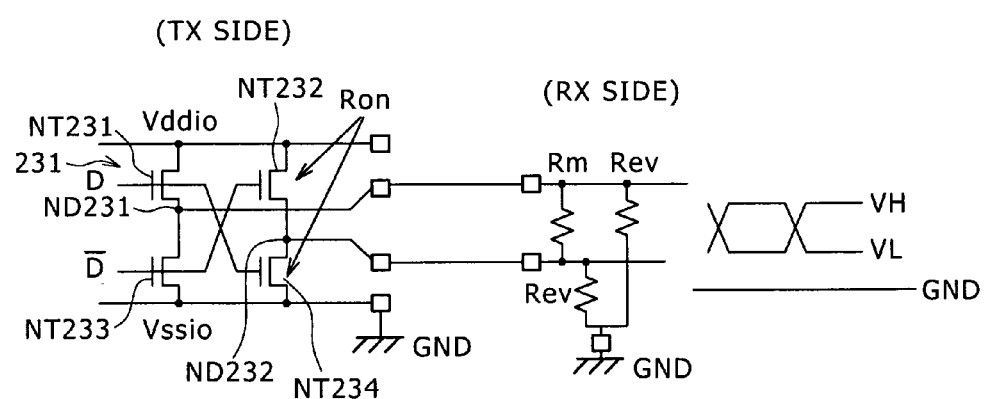
FIG. 5 is a diagram illustrating a configuration example of major components of a line driver of the transmitter according to the present embodiment.
Figure 6:
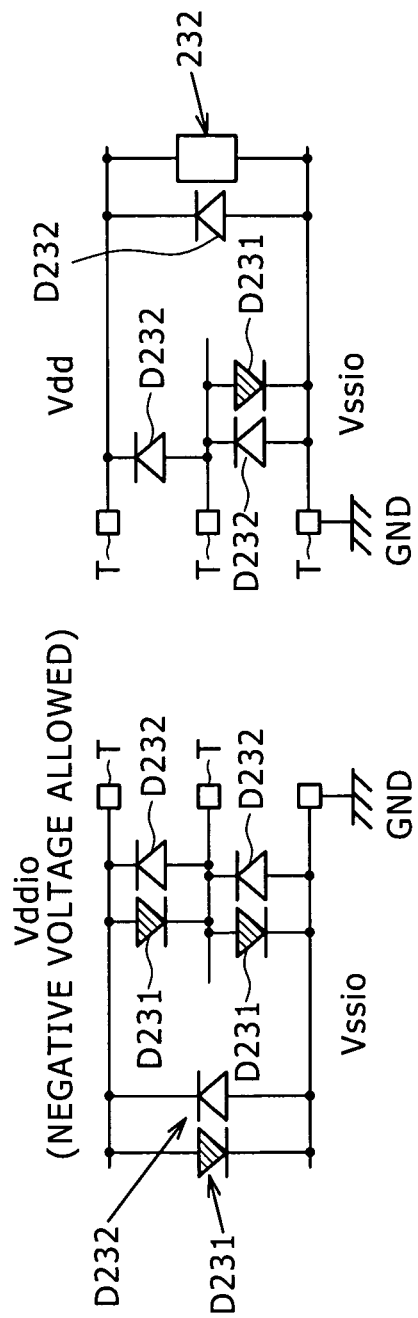
FIG. 6 is a diagram illustrating a configuration example of an electrostatic protection circuit of the line driver according to the present embodiment.

FIG. 5 is a diagram illustrating a configuration example of major components of the line driver of the transmitter according to the present embodiment. FIG. 6 is a diagram illustrating a configuration example of an electrostatic protection circuit of the line driver according to the present embodiment.

The line driver 230 includes a push-pull differential output circuit 231 made up of N-channel MOS (NMOS) transistors NT231 to NT234, as illustrated in FIG. 5.

The drains of the NMOS transistors NT231 and NT232 are connected to a power source Vddio for the line driver. The sources of the NMOS transistors NT233 and NT234 are connected to a power source Vssio.

The source of the NMOS transistor NT231 is connected to the drain of the NMOS transistor NT233. The connection point thereof forms a first output node ND231.

The source of the NMOS transistor NT232 is connected to the drain of the NMOS transistor NT234. The connection point thereof forms a second output node ND232.

The gates of the NMOS transistors NT231 and NT234 are connected to the supply line of normal phase data DT.

The gates of the NMOS transistors NT232 and NT233 are connected to the supply line of reverse phase data /DT ("/" denotes inversion).

The voltage of the power source Vddio is set, for example, at 0.4 V.

In the present embodiment, 8-bit data at 200 MHz transferred from the unshown core circuit is converted into 1-bit data at 1.6 Gbps by the serializer 210. The data is then transmitted over the transmission line 400 by the NMOS push-pull differential output circuit 231.

On the other hand, the synchronizing clock SYNC CLK is transmitted at 200 MHz.

In the line driver 230 used in the high-speed transmission system according to the present embodiment, the signal potentials of the serial data SDT and synchronizing clock SYNC CLK are set lower than the forward rise voltage of a P-N junction diode (e.g., 0.4 to 0.8 V). Further, forward P-N junction diodes D231 are provided in an electrostatic protection circuit 232 of input and output terminals T to provide enhanced electrostatic discharge strength. Reference numeral D232 denotes P-N junction diodes connected in opposite direction.

That is, in the present embodiment, the power source (Vddio) for the I/O and line driver is at a low potential close to a ground potential GND. Therefore, P-N junction diodes are inserted in forward direction as an ESD protection circuit, thus providing significantly improved ESD strength.

In this case, if the signal potential is greater than the forward rise voltage of a P-N junction diode, the forward P-N junction diodes D231 will turn on. This ensures higher electrostatic discharge strength than in the absence of the forward P-N junction diodes D231.

The receiver 300 expands the amplitude of the data transmitted over the transmission line 400 with the latched comparator to reproduce the data. A reproduction clock RCLK used at this time is generated based on the signal (synchronizing clock) which has been restored to its original amplitude from the low-amplitude synchronizing clock SYNC CLK by an amplifier. The reproduction clock RCLK is generated by a frequency multiplier adapted to compensate for the delay caused by the clock amplifier using a replica of the amplifier. The replica is provided in a phase-locked loop.

The receiver 300 includes a clock amplifier 310, phase-locked circuit (PLL) 320, latched comparator 330, clock buffer 340, timing generator 350 and deserializer 360 as illustrated in FIG. 4.

The amplifier 310 amplifies the synchronizing clock SYNC CLK transmitted over the transmission line 400 to restore the signal to its original amplitude and outputs the resultant clock to the PLL 320.

Figure 7:
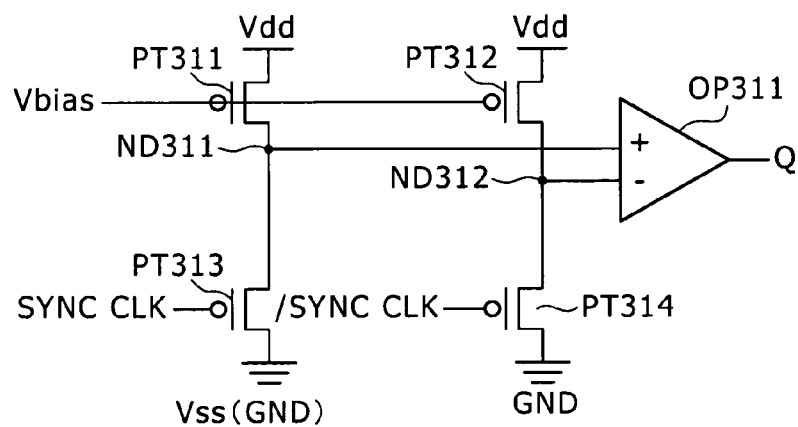
FIG. 7 is a circuit diagram illustrating a configuration example of a clock amplifier according to the present embodiment.

FIG. 7 is a circuit diagram illustrating a configuration example of the clock amplifier according to the present embodiment.

The clock amplifier 310 shown in FIG. 7 includes P-channel MOS (PMOS) transistors PT311 to PT314 and an operational amplifier OP311.

The sources of the PMOS transistors PT311 and PT312 are connected to a power source Vdd. The drains of the PMOS transistors PT313 and PT314 are connected to a power source Vss (ground potential GND).

The drain of the PMOS transistor PT311 is connected to the source of the PMOS transistor PT313. The connection point thereof forms a first node ND311.

The drain of the PMOS transistor PT312 is connected to the source of the PMOS transistor PT314. The connection point thereof forms a second node ND312.

The gates of the PMOS transistor PT311 and PT312 are connected to the supply line of a bias voltage Vbias.

The gate of the PMOS transistor PT313 is connected to the input line of the synchronizing clock SYNC CLK. The gate of the PMOS transistor PT314 is connected to the supply line of an inverted clock /SYNC CLK ("/" denotes inversion) of the synchronizing clock SYNC CLK.

The first node ND311 is connected to a non-inverted terminal (+) of the operational amplifier OP311. The second node ND312 is connected to an inverted terminal (−) of the same amplifier OP311.

As described above, the clock amplifier 310 has, at its first stage (input stage), a PMOS source-follower circuit having a level-shifting function. The same amplifier 310 is capable of amplifying the amplitude of the synchronizing clock SYNC CLK of low amplitude transmitted over the transmission line 400.

The received synchronizing clock SYNC CLK is delayed, for example, by time $\tau 1$ as a result of the amplification by the clock amplifier 310.

It should be noted that the clock has a constant period even after passing through an amplifier having frequency characteristic limitations. As a result, no fluctuations such as ISI will develop.

This delayed synchronizing clock SYNC CLK is fed to the PLL 320.

The PLL 320 includes a phase/frequency comparator (PFD) and charge pump circuit (CP) (hereinafter referred to as PDF&CP) 321, VCO 322, frequency divider 323, clock buffer 324 and replica amplifier 325 as illustrated in FIG. 4.

The PDF&CP 321 compares the phases (frequencies) of an input clock DLCLK and a reproduction clock (VCO clock) DRCLK. The reproduction clock DRCLK is obtained as a result of the frequency division by the frequency divider 323 in the phase-locked loop and transmitted via the clock buffer 324 and replica amplifier 325. The PDF&CP 321 supplies the comparison result to the VCO 322 in the form of a control voltage VCTL of given level.

The VCO 322 oscillates at a frequency commensurate with the control voltage VCTL from the PDF&CP 321 to supply the reproduction clock RCLK (VCO clock VCK) to the frequency divider 323 and clock buffer 340.

The frequency divider 323 divides the frequency of the VCO clock VCK from the VCO 322 by 1/n (multiplies by n) and outputs the frequency-divided reproduction clock DRCLK to the clock buffer 324 and timing generator 350.

The clock buffer 324 delays the frequency-divided reproduction clock DRCLK from the frequency divider 323, for example, by time T2 and outputs the delayed clock to the replica amplifier 325 as a frequency-divided reproduction clock DRCLK2.

The replica amplifier 325 has the same configuration, functionality and characteristics as the clock amplifier 310. The same amplifier 325 amplifies the frequency-divided reproduction clock DRCLK2 from the clock buffer 324, delays the same clock DRCLK2 by time $\tau 1$ and outputs the resultant clock to the PFD&CP 321.

In the PLL 320, the reproduction clock RCLK is generated based on the signal which has been restored to its original amplitude from the transmitted low-amplitude synchronizing clock SYNC CLK by the amplifier 310. The reproduction clock RCLK is generated by a frequency multiplier adapted to compensate for the delay caused by the amplifier 310 using at least a replica of the amplifier 310 provided in the phase-locked loop.

That is, the PLL 320 functions as a delay-compensating PLL.

At this time, the clock buffer 324 and other components of the PLL 320 operate on a source voltage of 1.2 V or 1.8 V.

In contrast, the clock amplifier 310 operates on a low amplitude (low voltage) such as 0.3 V.

The replica amplifier 325 is used to compensate for the delay caused by the clock amplifier 310 at the reception stage. In order to ensure ample compensation for the delay, however, the replica amplifier 325 presumably has a circuit configured exactly in the same manner as that of the clock amplifier 310.

In this case, the input of the replica amplifier 325 must be at a low voltage level such as 0.3 V which is the same as the reception stage (interface (IF) stage). As described earlier, the previous stage operates on a source voltage level of 1.8 V or so. As a result, a "level-down circuit" is required.

A voltage divider using resistors may seem a possible choice as such a level-down circuit. However, a voltage divider can be used only when the replica amplifier has high input impedance.

In contrast, the high-speed amplifier having a circuit according to the present embodiment has low input impedance. Therefore, the voltage division resistances must be reduced. This requires a large current flow to produce the signal amplitude, thus making it impossible to provide reduced power consumption.

Figure 8:
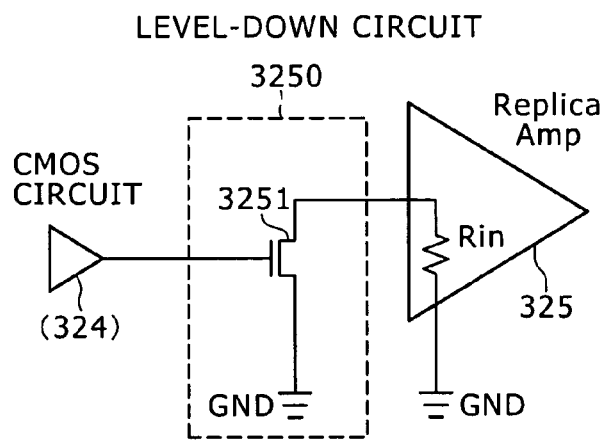
FIG. 8 is a diagram illustrating the basic configuration (equivalent circuit) of a level-down circuit according to an embodiment of the present invention.
Figure 9:
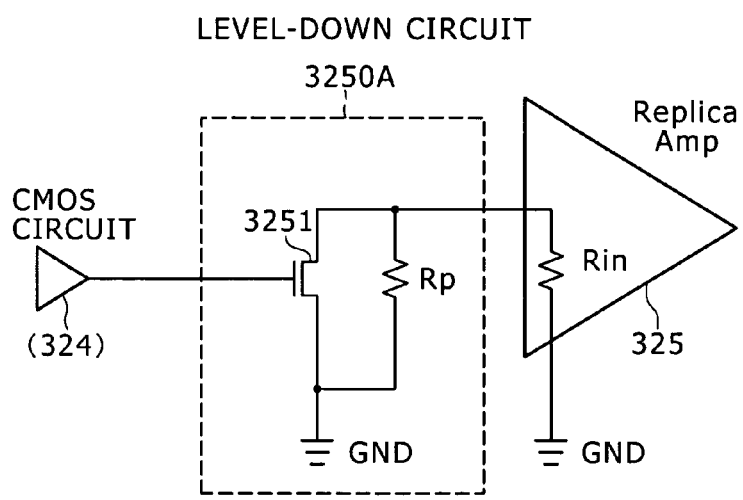
FIG. 9 is a diagram illustrating another configuration example of the level-down circuit according to the embodiment of the present invention.

For this reason, the present embodiment uses a level-down circuit as illustrated in FIG. 8 or FIG. 9.

FIG. 8 is a diagram illustrating the basic configuration (equivalent circuit) of a level-down circuit according to an embodiment of the present invention.

This level-down circuit 3250 includes a field effect transistor (FET) 3251 and brings the signal level from the level of the CMOS circuit (clock buffer 324) having the source voltage relative to GND down to the input signal level (e.g., 0.3 V relative to GND) of the replica amplifier 325 adapted to imitate the clock amplifier 310 at the first stage of the high-speed IF.

In this example, the FET 3251 includes an NMOS transistor. It should be noted that a separate bias source may be added to the circuit configuration as necessary.

In FIG. 8, reference numeral Rin denotes the input impedance of the replica amplifier 325. The signal level following the signal level reduction is determined by gm (transconductance) of the FET 3251 and the input impedance Rin.

Therefore, the signal level can be adjusted by arbitrarily selecting the gm of the FET 3251.

FIG. 9 is a diagram illustrating another configuration example of the level-down circuit according to the embodiment of the present invention.

A level-down circuit 3250A shown in FIG. 9 is a modification example of the level-down circuit shown in FIG. 8.

In FIG. 9, reference numeral Rp denotes the resistance used to adjust the signal level after the signal level reduction. The signal level after the signal level reduction is determined by the gm, input impedance Rin and resistance Rp.

Therefore, the circuit shown in FIG. 9 offers a greater degree of freedom in the adjustment of the signal level.

The level-down circuit according to the present embodiment provides the following advantageous effects as compared to other level-down circuits including a voltage division using resistors.

The level-down circuit according to the present embodiment operates only on low power consumption even when the input impedance of the circuit at the next stage is low, can be implemented with a small FET (further a small resistor as necessary), thus providing reduced circuit (layout) size, and provides a simple circuit (with one or two elements).

The latched comparator 330 expands the amplitude of the serial data SDT transmitted over the transmission line 400 and outputs the resultant data to the deserializer 360 for data reproduction.

The latched comparator 330 is capable of latching the received data and amplifying the data in parallel.

As described above, the received data SDT is latched at low amplitude without passing through an amplifier having frequency characteristic limitations, thus providing faster data reproduction.

Figure 10:
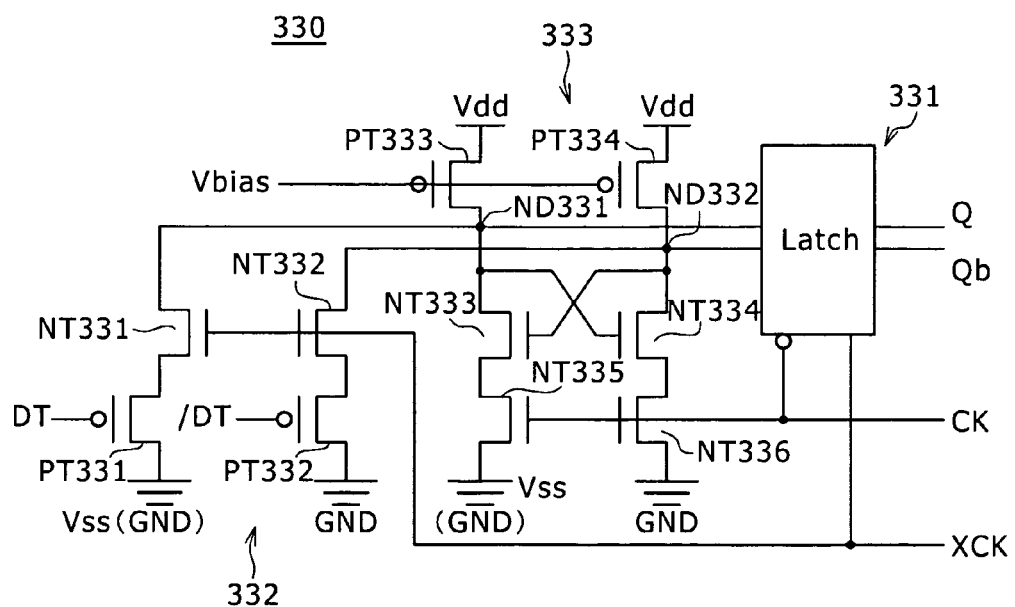
FIG. 10 is a circuit diagram illustrating a configuration example of a latched comparator according to the present embodiment.

FIG. 10 is a circuit diagram illustrating a configuration example of the latched comparator according to the present embodiment.

The latched comparator 330 shown in FIG. 10 includes PMOS transistors PT331 to PT334, NMOS transistors NT331 to NT336 and latch output section 331.

The PMOS transistors PT331 and PT332 and NMOS transistors NT331 and NT332 make up a level-shift section 332 at the input stage (first stage).

The PMOS transistors PT333 and PT334 and NMOS transistors NT334 to NT336 make up a latching-amplification section 333.

In the level-shift section 332 at the first stage (first stage), the drains of the PMOS transistors PT331 and PT332 are connected to a power source Vss (ground potential GND).

The source of the PMOS transistor PT331 is connected to the source of the NMOS transistor NT331. The drain of the NMOS transistor NT331 is connected to the drain of the PMOS transistor PT333.

The source of the PMOS transistor PT332 is connected to the source of the NMOS transistor NT332. The drain of the NMOS transistor NT332 is connected to the drain of the PMOS transistor PT334.

The gate of the PMOS transistor PT331 is connected to the input line of the normal phase data DT. The gate of the PMOS transistor PT332 is connected to the input line of the reverse phase data /DT.

The gates of the NMOS transistors NT331 and NT332 are both connected to the supply line of an inverted clock XCK.

The level-shift section 332 configured as described above changes the level of the low-amplitude data from a low level such as 0.3 V to a level around Vdd (e.g., 1.8 V)/2, i.e., 0.8 V or 0.9 V.

In the latching-amplification section 333, the sources of the PMOS transistors PT333 and PT334 are connected to the power source Vdd.

The drain of the PMOS transistor PT333 is connected to the drain of the NMoS transistor NT333. The connection point thereof forms a first node ND331.

The drain of the PMOS transistor PT334 is connected to the drain of the NMOS transistor NT334. The connection point thereof forms a second node ND332.

The source of the NMOS transistor NT333 is connected to the drain of the NMOS transistor NT335. The source of the NMOS transistor NT335 is connected to the power source Vss (ground potential GND).

The source of the NMOS transistor NT334 is connected to the drain of the NMOS transistor NT336. The source of the NMOS transistor NT336 is connected to the power source Vss (ground potential GND).

The gates of the PMOS transistors PT333 and PT334 are connected to the supply line of the bias voltage Vbias.

The gate of the NMOS transistor NT333 is connected to the second node ND332. The gate of the NMOS transistor NT334 is connected to the first node ND331.

The gates of the NMOS transistors NT335 and NT336 are connected together to the supply line of a clock CK.

In the latched comparator 330 configured as described above, the inverted clock XCK is supplied to the level-shift section 332 at the first stage (first stage), and the clock CK to the latching-amplification section 333 at the next stage. As a result, after the level shifting at the first stage, the latching-amplification section 333 at the next stage is activated by the clock CK, causing the input data to be latched and amplified in parallel.

Then, the latched and amplified data is fed to the latch output section 331 from the first and second nodes ND331 and ND332.

The latch output section 331 latches the input data in synchronism with the clock CK and inverted clock XCK and outputs the data as data Q and Qb.

The clock buffer 340 delays the reproduction clock RCLK (VCO clock VCK) from the PLL 320 by time T2 and outputs the resultant clock to the latched comparator 330 and deserializer 360 as the clocks CK and XCK.

The timing generator 350 receives the frequency-divided clock from the frequency divider 323 of the PLL 320, generates conversion and output timing signals and outputs the generated signals to the deserializer 360.

The deserializer 360 converts the data received in the form of serial data into N-bit parallel data in synchronism with the clock signals CK and XCK from the clock buffer 340 and the timing signals from the timing generator 350.

A description will be given next of the operation achieved by the above configuration with reference to the timing diagram illustrated in FIGS. 11A to 11F.

It should be noted that FIGS. 11A to 11F are a timing diagram of the receiver of the communication system according to the present embodiment.

In the transmitter 200, the serializer 210 converts N-bit parallel data, which is updated every time T in synchronism with the synchronizing clock SYNC CLK and transferred from the unshown core circuit, into 1-bit serial data which is updated every time T/N.

Then, the line driver 230 transmits this serial data and synchronizing clock SYNC CLK at a low amplitude close to the ground potential (0.2 V or 0.3 V) over the transmission line 400.

The serial data SDT and synchronizing clock SYNC CLK transmitted over the transmission line 400 are received by the receiver 300.

In the receiver 300, the serial data SDT is fed to the latched comparator 330 at the timing illustrated in FIG. 11A. The synchronizing clock SYNC CLK is fed to the clock amplifier 310 at the timing illustrated in FIG. 11B.

The clock amplifier 310 amplifies the amplitude of the synchronizing clock SYNC CLK of low amplitude transmitted over the transmission line 400 to expand its amplitude.

The synchronizing clock SYNC CLK amplified by the clock amplifier 310 is delayed, for example, by time τ1 as a result of the amplification as illustrated in FIGS. 11B and 11C, and fed to the PDF&CP 321 of the PLL 320 as the signal DLCLK.

It should be noted that the clock DLCLK has a constant period even after passing through an amplifier having frequency characteristic limitations. As a result, no fluctuations such as ISI will develop.

The PDF&CP 321 compares the phases (frequencies) of the input clock signal DLCLK and the reproduction clock (VCO clock) DRCLK2. The reproduction clock DRCLK2 is obtained as a result of the frequency division by the frequency divider 323 in the phase-locked loop and transmitted via the clock buffer 324 and replica amplifier 325. As a result, the control voltage VCTL of given level is supplied from the PDF&CP 321 to the VCO 322.

The VCO 322 oscillates at a frequency commensurate with the control voltage VCTL from the PDF&CP 321 to generate the reproduction clock RCLK (VCO clock VCK), as illustrated in FIG. 11D, which is then supplied to the frequency divider 323 and clock buffer 340.

The frequency divider 323 divides the frequency of the VCO clock VCK from the VCO 322 by 1/n (multiplies by n) and outputs the resultant clock to the clock buffer 324 and timing generator 350 as the frequency-divided reproduction clock DRCLK.

It should be noted that the delay caused by the frequency divider 323 is negligibly small.

Here, therefore, the reproduction clock RCLK generated by the VCO 322 is shown to be in phase with the frequency-divided reproduction clock DRCLK from the frequency divider 323, as illustrated in FIG. 11D.

The clock buffer 324 delays the frequency-divided reproduction clock DRCLK from the frequency divider 323, for example, by time 12 as illustrated in FIGS. 11D and 11E and outputs the delayed clock to the replica amplifier 325 as the frequency-divided reproduction clock DRCLK2.

The replica amplifier 325 has the same configuration, functionality and characteristics as the clock amplifier 310. The same amplifier 325 amplifies the frequency-divided reproduction clock DRCLK2 from the clock buffer 324, delays the clock by time τ1 as does the clock amplifier 310 and outputs the resultant clock to the PFD&CP 321.

As described above, the frequency multiplier of the PLL 320 generates the reproduction clock RCLK based on the signal which has been restored to its original amplitude from the low-amplitude synchronizing clock by the amplifier. The reproduction clock is compensated for the delay caused by the clock amplifier 310 using the replica amplifier 325 of the clock amplifier 310 provided in the phase-locked loop.

The reproduction clock RCLK from the VCO 322 is delayed by time i2 by the clock buffer 340 and supplied to the latched comparator 330 and deserializer 360 as the clocks CK and XCK.

The latched comparator 330 latches and amplifies the received data simultaneously in parallel in synchronism with the clock signals CK and XCK.

Then, the deserializer 360 converts the data received in the form of serial data into N-bit parallel data in synchronism with the clock signals CK and XCK and the timing signals from the timing generator 350.

According to the present embodiment described above, the communication system 100 includes the transmitter 200 and receiver 300. The transmitter 200 includes the serializer 210, clock generator 220 and line driver 230. The serializer 210 converts N-bit parallel data, which is updated every time T, into 1-bit serial data which is updated every time T/N. The clock generator 220 generates the synchronizing clock SYNC CLK whose level changes at the end of the serialization. The line driver 230 transmits the serial data at a low amplitude close to the ground potential. The receiver 300 expands the amplitude of the data transmitted over the transmission line 400 with the latched comparator 330 to reproduce the data. The reproduction clock RCLK used at this time is generated based on the signal which has been restored to its original amplitude from the low-amplitude synchronizing clock SYNC CLK by the amplifier 310. The reproduction clock RCLK is generated by the frequency multiplier adapted to compensate for the delay caused by the clock amplifier 310 using at least the replica amplifier 325 of the clock amplifier 310 provided in the phase-locked loop. As a result, the communication system 100 provides the following advantageous effects.

The receiver can compensate for the delay caused by the amplifier adapted to expand the amplitude.

This permits reproduction of an optimal clock for data reproduction, and by extension, reproduction of data with high accuracy.

Further, in the line driver 230 of the transmitter used in the high speed data transmission system, the signal potentials of the data SDT and synchronizing clock SYNC CLK to be transmitted are set lower than the forward rise voltage of a P-N junction diode. Further, the forward P-N junction diodes D231 are provided in the electrostatic protection circuit 232 of the input and output terminals. This provides enhanced electrostatic discharge strength, thus allowing for stable transmission of low-amplitude signals.

Figure 12:
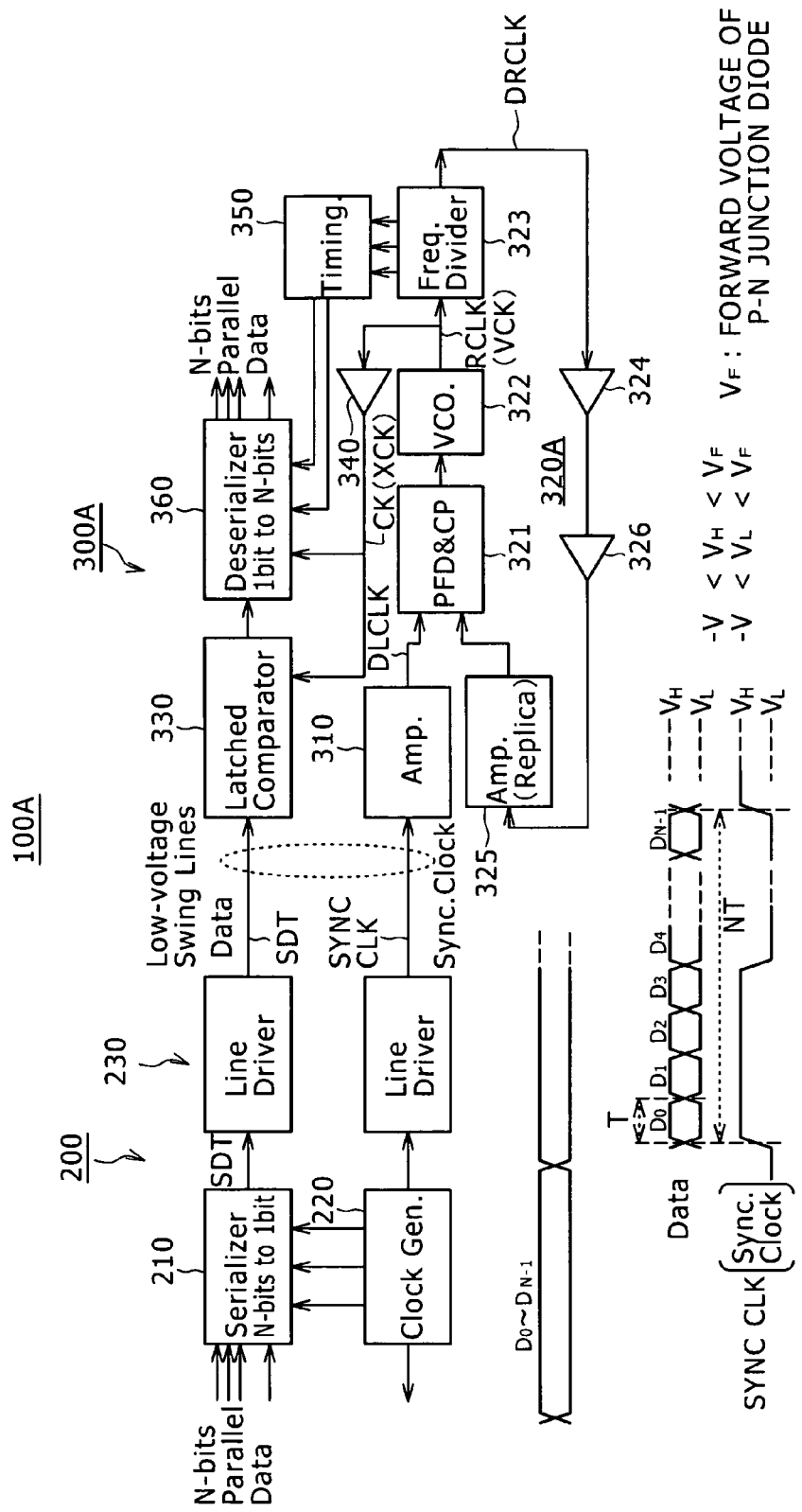
FIG. 12 is a diagram illustrating the basic configuration of the communication system according to another embodiment of the present invention.
Figure 13:
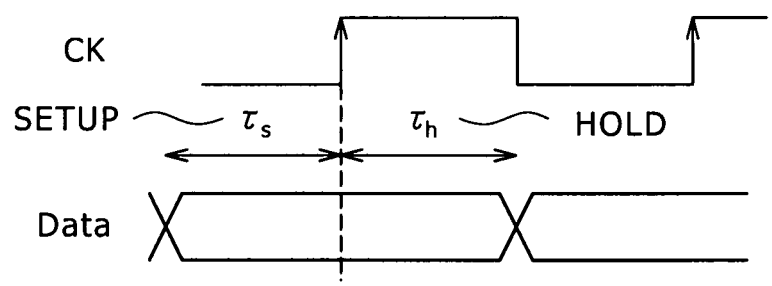
FIG. 13 is a diagram illustrating a setup signal and hold time of the latched comparator.

FIG. 12 is a diagram illustrating the basic configuration of the communication system according to another embodiment of the present invention.

The embodiment illustrated in FIG. 12 differs from that illustrated in FIG. 4 in that a delay element 326 as illustrated in FIG. 12 is provided in the phase-locked loop of a PLL 320A (output side of the clock buffer 324 in FIG. 12) to provide a faster high-speed data transmission system. The delay element 326 introduces a delay adapted to imitate a setup signal Ts of the latched comparator 330.

Except for the above difference, the embodiment illustrated in FIG. 12 is configured identically to the embodiment described earlier and yet provides the same advantageous effects.

It should be noted that the embodiments of the present invention are not limited to those described above but may be modified in various ways without departing from the scope of the present invention.

The present application contains subject matter related to that disclosed in Japanese Priority Patent Application JP 2008-063004 filed in the Japan Patent Office on Mar. 12, 2008, the entire content of which is hereby incorporated by reference.

What is claimed is:

1. A communication system comprising:
a transmitter adapted to transmit a synchronizing clock and serial data synchronous with the synchronizing clock over a line at low amplitude; and
a receiver adapted to receive the serial data and synchronizing clock from the transmitter, the receiver including:
an amplifier adapted to amplify the received synchronizing clock of low amplitude to restore the clock to its original amplitude,
a latched comparator adapted to latch the received serial data in synchronism with a reproduction clock, the latched comparator including a level-shift section that increases a level of the received serial data to a predetermined level and a latching-amplifying section;
wherein, when activated by the reproduction clock, the latching-amplifying section implements latching and amplifying of the received serial data in parallel, and
a phase-locked circuit, the phase-locked circuit adapted to generate the reproduction clock based on the synchronizing clock which has been restored to its original amplitude from the low amplitude synchronizing clock by the amplifier, the phase-locked circuit includes a frequency divider adapted to divide the frequency of the reproduction clock, the frequency divided reproduction clock being compensated for a delay caused by the amplifier using a replica amplifier functioning in a similar manner to the amplifier and provided in a phase-locked loop,
wherein the replica amplifier has a level-down circuit at its input stage, the level-down circuit having a field effect transistor adapted to receive the frequency divided reproduction clock at its gate so as to reduce the level of the frequency divided reproduction clock.

2. The communication system of claim 1, wherein a delay element is provided in the phase-locked loop to introduce a delay adapted to imitate a setup signal of the latched comparator.

3. The communication system of claim 1, wherein the phase-locked circuit comprises:
a voltage-controlled oscillator adapted to generate the reproduction clock;
the replica amplifier adapted to receive the frequency divided reproduction clock and amplify the clock; and
a phase comparator adapted to compare the phases of the synchronizing clock amplified by the amplifier and the output clock from the replica amplifier and output a control signal commensurate with the comparison result to the voltage-controlled oscillator.

4. A receiver for receiving a synchronizing clock transmitted over a line at low amplitude and serial data synchronous with the synchronizing clock, the receiver comprising:
an amplifier adapted to amplify the received synchronizing clock of low amplitude to restore the clock to its original amplitude;
a latched comparator adapted to latch the received serial data in synchronism with a reproduction clock, the latched comparator including a level-shift section that increases a level of the received serial data to a predetermined level and a latching-amplifying section;
wherein, when activated by the reproduction clock, the latching-amplifying section implements latching and amplifying of the received serial data in parallel; and
a phase-locked circuit, the phase-locked circuit adapted to generate the reproduction clock based on the synchronizing clock which has been restored to its original amplitude from the low amplitude synchronizing clock by the amplifier, the phase-locked circuit includes a frequency divider adapted to divide the frequency of the reproduction clock, the frequency divided reproduction clock being compensated for a delay caused by the amplifier using a replica amplifier functioning in a similar manner to the amplifier and provided in a phase-locked loop,
wherein the replica amplifier has a level-down circuit at its input stage, the level-down circuit having a field effect transistor adapted to receive the frequency divided reproduction clock at its gate so as to reduce the level of the frequency divided reproduction clock.

5. The receiver of claim 4, wherein a delay element is provided in the phase-locked loop to introduce a delay adapted to imitate a setup signal of the latched comparator.

6. The receiver of claim 4, wherein the phase-locked circuit comprises:

a voltage-controlled oscillator adapted to generate the reproduction clock;

the replica amplifier adapted to receive the frequency divided reproduction clock and amplify the clock; and a phase comparator adapted to compare the phases of the synchronizing clock amplified by the amplifier and the output clock from the replica amplifier and output a control signal commensurate with the comparison result to the voltage-controlled oscillator.

7. A reception method for receiving a synchronizing clock transmitted over a line at low amplitude and serial data synchronous with the synchronizing clock, the reception method comprising the steps of:

amplifying, by using an amplifier, the synchronizing clock of low amplitude to restore the synchronizing clock to its original amplitude;

generating a reproduction clock based on the synchronizing clock which has been restored to its original amplitude from the low amplitude synchronizing clock by the amplifier and dividing the frequency of the reproduction clock, the frequency divided reproduction clock being compensated for a delay caused by the amplifier using a replica amplifier functioning in a similar manner to the amplifier and provided in a phase-locked loop; and latching the serial data using a latched comparator in synchronism with the reproduction clock, the latching step including a level-shift step that increases a level of the serial data to a predetermined level and a latching-amplifying step:

wherein, when activated by the reproduction clock, the latching-amplifying step implements latching and amplifying of the serial data in parallel, and wherein the replica amplifier has a level-down circuit at its input stage, the level-down circuit having a field effect transistor adapted to receive the frequency divided reproduction clock at its gate so as to reduce the level of the frequency divided reproduction clock.

* * * * *